US008686552B1

(12) United States Patent
Chow et al.

(10) Patent No.: US 8,686,552 B1
(45) Date of Patent: Apr. 1, 2014

(54) MULTILEVEL IC PACKAGE USING INTERCONNECT SPRINGS

(71) Applicant: Palo Alto Research Center Incorporated, Palo Alto, CA (US)

(72) Inventors: Eugene M. Chow, Fremont, CA (US); Dirk DeBruyker, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/802,724

(22) Filed: Mar. 14, 2013

(51) Int. Cl.
*H01L 23/10* (2006.01)

(52) U.S. Cl.
USPC ........................................................ 257/686

(58) Field of Classification Search
USPC ........... 257/686, 777, 772, 778; 438/109, 108
See application file for complete search history.

(56) References Cited

U.S. PATENT DOCUMENTS

| | | | |
|---|---|---|---|
| 3,842,189 | A | 10/1974 | Southgate |
| 5,613,861 | A | 3/1997 | Smith et al. |
| 7,082,684 | B2 | 8/2006 | Hantschel et al. |
| 7,554,185 | B2 | 6/2009 | Foong et al. |
| 7,776,652 | B2 | 8/2010 | Wark |
| 7,786,572 | B2 | 8/2010 | Chen |
| 8,530,276 | B2 * | 9/2013 | Hilt et al. .................... 438/109 |
| 2006/0243483 | A1 * | 11/2006 | Kirby et al. .................. 174/267 |
| 2007/0139899 | A1 * | 6/2007 | Van Schuylenbergh et al. ........................... 361/760 |
| 2008/0067661 | A1 * | 3/2008 | Kawabata ..................... 257/686 |
| 2008/0173998 | A1 * | 7/2008 | Mahler et al. ................. 257/686 |
| 2009/0140433 | A1 * | 6/2009 | Bloom et al. .................. 257/773 |
| 2009/0243092 | A1 * | 10/2009 | Nishimura et al. ........... 257/737 |
| 2011/0255850 | A1 * | 10/2011 | Dinh et al. .................... 396/176 |
| 2012/0067637 | A1 | 3/2012 | Chow |
| 2012/0068331 | A1 | 3/2012 | Chow et al. |
| 2012/0088330 | A1 | 4/2012 | Chua et al. |

OTHER PUBLICATIONS

Vempati, S. R. et al. "Development of 3-D Silicon Die Stacked Package Using Flip Chip Technology with Micro Bump Interconnects", IEEE Electronic Components and Technology Conference, 2009, pp. 980-987.

* cited by examiner

*Primary Examiner* — Nathan Ha
(74) *Attorney, Agent, or Firm* — Bever, Hoffman & Harms, LLP; Patrick T. Bever

(57) ABSTRACT

A stacked-die electronic package assembly includes IC chips connected to a base substrate in a flip-chip, offset (e.g., pyramid-type) stacked arrangement by way of single-curved interconnect springs. Each interconnect spring is patterned from a spring metal film that bends to form a cantilevered structure having an anchor portion secured to the base substrate, a body portion that curves upward from the base substrate, and a tip disposed at the free end of the body portion. The IC chips are mounted onto interconnect springs such that contact pads on the chips contact the spring tips, causing the springs to slightly compress. Optional solder is utilized to secure the connection of the spring tips to the contact pads. Optional spacers and adhesive are utilized to maintain proper spacing between the IC chips and the base substrate. The springs are formed with different tip heights to facilitate connection to the stacked IC chips.

20 Claims, 9 Drawing Sheets

MULTILEVEL IC PACKAGE USING INTERCONNECT SPRINGS

FIELD OF THE INVENTION

This invention relates to multilevel (stacked-die) electronic package assemblies, and more particularly to a flip-chip, stacked-die electronic package assembly and associated production methods.

BACKGROUND OF THE INVENTION

In electronics manufacturing, integrated circuit packaging is the final stage of semiconductor device fabrication, in which the tiny block of processed semiconducting material (i.e., an integrated circuit (IC) chip or die) is encased in a supporting case that prevents physical damage and corrosion. The case, known as a "package", typically includes a package substrate that supports and provides electrical contacts between the packaged IC chips and an external circuit board. There are many electronic package types for both single and multiple die arrangements, and a few different methods for interconnecting the IC chips and package substrate. A case or cover is often secured or formed over the interconnected IC chips and package substrate for protection.

Wire bonding is the primary method of making interconnections between an IC chip and a package substrate in an electronic package. Wire bonding is performed by high-speed bonding machines that pushes a suitable metal (e.g., copper) though an outlet to form a first (ball or wedge) bond on a target contact pad of an IC chip, then forms a wire while moving to the outer periphery of the IC chip, then forms a second bond on an associated contact pad in a peripheral area of the package substrate. The resulting wire bond is very tolerance of production and thermal expansion mismatch variances. That is, manufacturing imperfections in the IC chips are easily tolerated by forming large contact pads that are reliably contacted by the wire bonding machine. Also, the long wire flexes to tolerate thermal expansion mismatches between the die and package substrate, thereby avoiding unwanted disconnections that can cause system failures.

Although wire bonds provide design tolerances to production and thermal mismatches, there are multiple problems with the wire bond interconnect approach. First, the relatively long wire bonds create large parasitics, such as high inductance, which reduces the bandwidth of the packaged system. Second, the footprint of package utilizing wire bonding is relatively large because the package substrate must be significantly larger than the IC chips to provide for connection to the lower ends of the wire bonds, which are disposed around the perimeter of the IC chips. Also, the height of the resulting wire bond package is relatively tall because each wire bond requires an arch or loop for structural integrity reasons that extends significantly above the upper surface of the packaged IC chips. Finally, the density of wire bond interconnects is low because the wire bonds are long, and because it is very difficult to create a large number of wire-bond connections in a small area without danger of the wires making undesirable contact with each other.

Stacked-die Multi-Chip Module (MCM) packaging is an electronic package type in which two or more die mounted on top of each other in a single package to significantly increase the amount of silicon chip area for a given package footprint, conserving precious real estate on a host system's printed circuit board, and simplifying the board assembly process. Aside from space savings, die stacking also results in better electrical performance of the device, since the shorter inter-package routing connections between the two or more chips/circuits results in faster signal propagation and reduction in noise and cross-talk. Early stacked-die MCM packages included two memory chips, such as Flash and SRAM devices, but more recent die-stacking arrangement now involve up to six or more chips of varying function or technology, e.g., logic, analog, mixed-signal, etc.

Stacked die MCM arrangements include pyramid-type and equal-size die stacking arrangements. In pyramid-type stacking arrangements, different sized die are stacked with the smaller die concentrically disposed on top of larger die, providing an arrangement that is conductive to wire bond interconnects because the outer perimeter of each die is exposed for access by the wire bond forming machine. Equal-size die stacking allows for larger total chip area than pyramid-type stacking arrangements, but restricts wire bond connections to the uppermost die in the stack.

Solder-based flip-chip connections, also known as controlled collapse chip connection or its acronym, C4, represent another method for interconnecting equal-size stacked IC chips in an MCM package by way of solder bumps that have been deposited onto the chip contact (input/output) pads. In order to mount the chips to external circuitry (i.e., a package substrate or a neighboring IC chip), it is flipped over so that its top side faces down, and aligned so that the deposited solder bumps align with matching pads on the neighboring IC chip or package substrate, and then the solder is flowed to complete the interconnect. In comparison to wire bond interconnects, the solder-based flip-chip interconnect approach facilitates higher system bandwidths, a smaller package footprint (i.e., because all of the connections are disposed between the IC chip stack and the package substrate), and a lower package height (due to the elimination of the wire bond loops).

Although solder-type flip-chip technology provides several advantages over wire bond interconnections, the solder-based flip-chip approach requires that the stacked IC chips be fabricated to include expensive through-chip electrical vias in order to create access to the backside of each chip. Also, flip-chip technology provides very little tolerance for production and thermal expansion mismatch variances. That is, manufacturing imperfections in the IC chips can result in failure to complete one or more required connections, or thermal expansion mismatches between the die and package substrate materials can cause solder cracks and separation that creates system failures.

What is needed is a packaging technology that provides both the production and thermal tolerances of wire bond interconnects, and the higher density and bandwidth associated with solder-based flip-chip interconnects.

SUMMARY OF THE INVENTION

The present invention is directed to a flip-chip, stacked-die electronic package assembly in which two or more integrated circuit (IC) chips (die) are disposed over a base substrate in an offset (e.g., pyramid-type) stacked die arrangement (e.g., a pyramid-type arrangement with a smaller die disposed between a larger die and the base substrate, or an offset chip arrangement having multiple chips at different heights from a base substrate), where all of the IC chips are electrically connected to contact pads disposed on the base substrate by way of single-curved interconnect springs. Each interconnect spring is a cantilever-type, integrally connected spring-metal structure including a flat anchor portion, a curved (bent) body portion extending away from the anchor portion, and a tip portion disposed at the end of the body portion. A first group of the interconnect springs extend a relatively short distance between the contact pads on the lower (smaller) die (or dies) and associated first contact pads on the base substrate, and a second group of the interconnect springs extend a relatively long distance between contact pads disposed on a peripheral region of the upper (larger) die (or dies) and associated second contact pads on the base substrate. The use of interconnect springs provides advantages over conventional wire-bond stacked-die and conventional solder-based flip-chip packaging approaches. Specifically, similar to conventional solder-based flip-chip arrangements, the present invention facilitates higher interconnect density and higher device speeds than that achieved by conventional wire-bond stacked-die packaging approaches because the interconnect springs are shorter and have lower inductance than conventional wire bonds. In addition, the overall package height and package footprint are made smaller because all of the die-to-base interconnections (i.e., the interconnect springs) can be entirely disposed under the die stack (similar to solder-based flip-chip approaches), eliminating the significant peripheral area and clearance required to provide wire-bond connections. Moreover, the interconnect springs provide advantages over conventional solder-based flip-chip packaging approaches in that the springs maintain the required connections over a relatively large range of offset distances between the IC chips and the base substrate, thereby providing a more compliant packaging technology that helps address thermal expansion mismatches (and other production variances) between the die and the substrate materials.

In one embodiment each of the interconnect springs is fabricated by patterning one or more stress engineered thin films on the base substrate to form elongated flat spring-metal islands, and then releasing one end of each spring-metal island such that the released portion rises to form a cantilever-type single-curved (bent) interconnect spring having a tip that is disposed away from the base substrate. Spring-metal islands having different lengths are patterned before release, resulting in interconnect springs whose tips are disposed at different release-heights that correspond to the die to which each spring tip is to be connected. Alternatively, the release height of spring-metal islands having the same length are adjusted using a separate load layer. In another alternative embodiment, the interconnect springs are formed with the same length and tip height, and the springs are simply bent by the chip stack into their final tip height. Other spring fabrication techniques may also be used to form single-curve interconnect springs, such as forming the spring-metal islands using a solid solution metal layer, and creating the bent-spring structure by annealing the spring metal islands to cause the metal layer material to transition from the solid solution to an intermetallic compound, e.g., as disclosed in co-owned U.S. Pat. No. 7,082,684, which is incorporated herein by reference in its entirety.

According to another embodiment of the present invention, a method for assembling a flip-chip, stacked-die electronic package assembly includes forming spring metal islands on a base substrate using one of the methods described above, releasing body and tip portions of the spring-metal islands to form single-curved interconnect springs, and then mounting two or more IC chips (die) onto the tips of the interconnect springs such that the IC chips compress at least some of the springs, and such that associated groups of the interconnect springs create electrical contacts with each of the IC chips. In an alternative embodiment, solder is utilized to secure the interconnect spring tips to the IC chip contact pads. In other alternative embodiments, either a spacer or adhesive (or both) are utilized to maintain the IC chips at a desired distance from the base substrate. In yet other alternative specific embodiments the IC chips are either connected by adhesive prior to the mounting process, or are mounted separately onto the base substrate. In yet another embodiment the interconnect springs are formed on the IC chips such that the tips of the springs contact the base substrate during assembly.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in multi-level packaging. The following description is presented to enable one of ordinary skill in the art to make and use the invention as provided in the context of a particular application and its requirements. As used herein, directional terms such as "upper", "lower", "downward", "front" and "rear", are intended to provide relative positions for purposes of description, and are not intended to designate an absolute frame of reference. In addition, the phrases "integrally connected" are used herein to describe the mechanical connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. The terms "coupled" and "connected", when utilized in the electrical sense herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
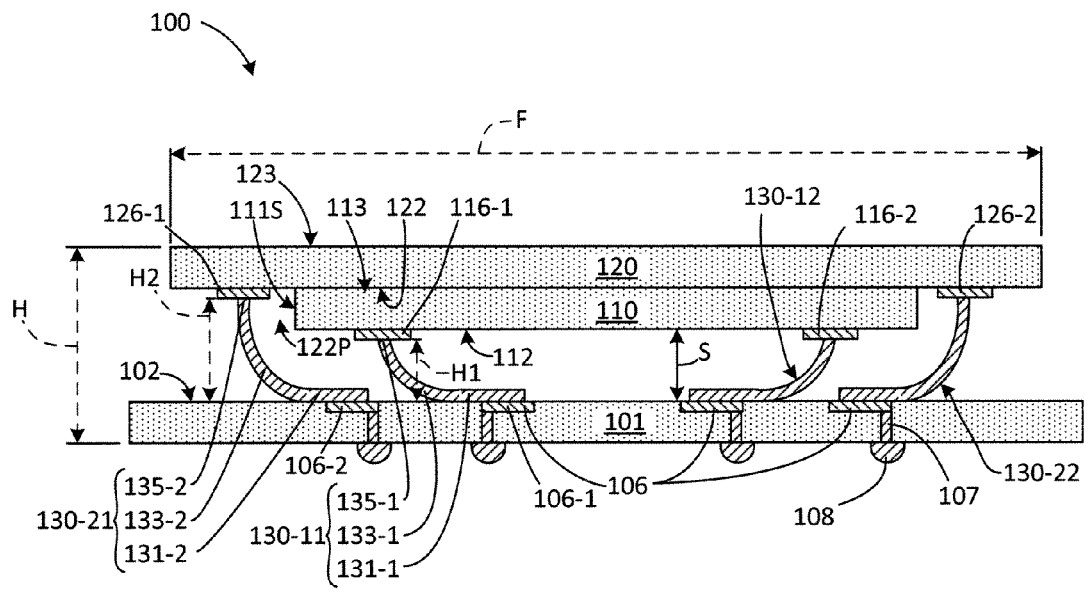
FIG. 1 is a cross-sectional side view showing a flip-chip, stacked-die electronic package assembly according to a simplified exemplary embodiment of the present invention.

FIG. 1 is a cross-sectional diagram showing a simplified flip-chip, offset stacked-die electronic package assembly 100 according to a simplified exemplary embodiment of the present invention. Assembly 100 generally includes a smaller (first) die 110 and a larger (second) die 120 that are connected to a base substrate 101 by way of single-curved interconnect springs 130-11, 130-12, 130-21 and 130-22.

Referring to the lower portion of FIG. 1, base substrate 101 includes a flat piece of non-conductive (e.g., plastic or ceramic) base material having a planar upper base surface 102, and four base contact pads 106 that are disposed on upper base surface 102. Contact pads 106 are connected to associated output pins (e.g., solder bumps 108) by way of a pattern of conductors (e.g., vias 107 and associated metal traces, not shown) that are disposed in the non-conductive base material utilizing techniques known in the art.

Die 110 and die 120 are "bare" (unpackaged) chips (i.e., flat, typically square sections of a silicon wafer) that have been processed using any known integrated circuit fabrication technique (e.g., a CMOS process flow) to include an associated electronic device. In one embodiment dies 110 and are both memory devices.

Die 110 and die 120 are disposed in a "flip-chip" (upside-down) pyramid-type stacked arrangement over base substrate 101 such that smaller die 110 is disposed between larger die 120 and base substrate 101. The phrase "flip-chip" is intended to mean that "front" surfaces 112 and 122 of dies 110 and 120, respectively (i.e., the surfaces of dies 110 and 120 that are facing base substrate 110) include contact pads 116 and 126 that are operably coupled to the integrated circuits respectively formed on die 110 and 120 (i.e., contact pads 116 are positioned such that they could otherwise be connected to base substrate 101 by way of solder-based flip-chip interconnections). The term "stacked" used to indicate that a planar rear surface 113 of the die 110 abuts planar front surface 122 of the second die 120, where "abuts" denotes either direct contact or connection by way of adhesive, linkage or a stand-off structure. The phrase "pyramid-type stacked arrangement" is intended to mean that smaller die 110 is centered with respect to larger die 120 such that a peripheral upper edge portion 122P of the second front surface 122 is exposed entirely around a peripheral side edge 111S of the first die 110. Although the invention is primarily described below with reference to pyramid-type offset stacked arrangements, the present invention also relates to other offset stacked-type arrangements (e.g., see discussion below with reference to FIG. 10).

Figure 2:
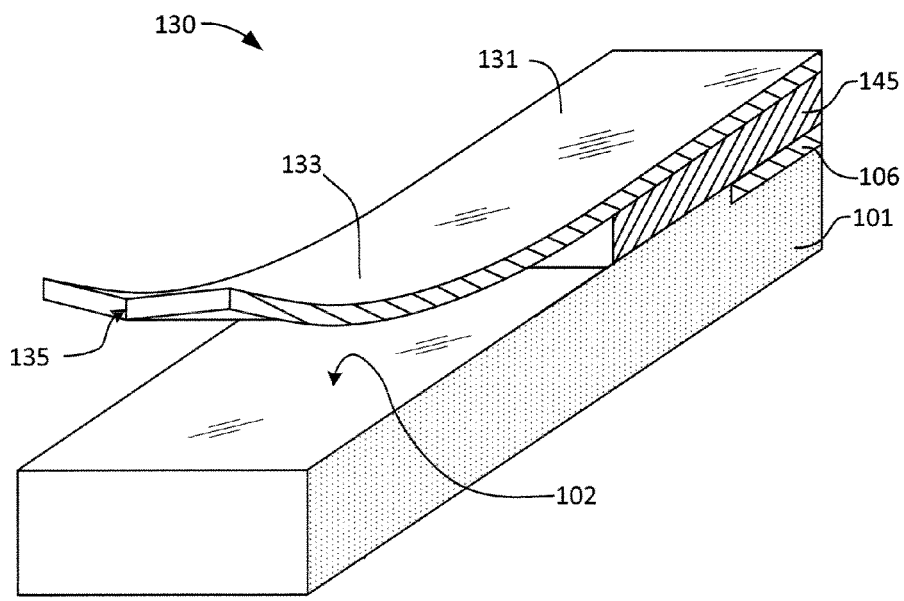
FIG. 2 is a top front perspective view showing an exemplary interconnect spring utilized in the assembly of FIG. 1.

FIG. 2 shows a single-curved interconnect springs 130 that is representative of the interconnect springs utilized on assembly 100 (FIG. 1). Interconnect spring 130 includes a flat anchor portion 131, a curved body portion 133 extending away from the anchor portion, and a tip portion 135 disposed at the free end of body portion 133. In some embodiments interconnect spring 130 is connected to associated base contact pad 106 by way of a conductive release portion 145 whose function and formation are described below. Note that flat anchor portion 131 is disposed parallel to planar upper surface 102 of base substrate 101.

Referring again to FIG. 1, according to an aspect of the present invention there are two groups of interconnect springs that are respectively connected between base substrate 101 and dies 110 and 120. Specifically, the first group of interconnect springs, which includes springs 130-11 and 130-12, are connected between substrate 101 and smaller die 110, and the second group of interconnect springs, which includes springs 130-21 and 130-22, are connected between substrate 101 and larger die 120. Referring to the left side of FIG. 1, interconnect spring 130-11 extends between base substrate 101 and first die 110 and is connected such that spring 130-11 forms a (first) electrical connection between a (first) base contact pad 106-1 formed on upper base surface 102 and an associated (first) die contact pad 116-1 disposed on front surface 112 of die 110. Similarly, interconnect spring 130-21 extends between base substrate 101 and die 120 and is connected such that spring 130-21 forms a (second) electrical connection between a (second) base contact pad 106-2 on upper base surface 102 and an associated (second) die contact pad 116-2 disposed on front surface 122 of die 120.

In accordance with the exemplary embodiment, the anchor portions of all springs 130 are attached to base substrate 101, and all of the spring bodies extend upward such that their spring tips contact either die 110 or die 120. Specifically, flat anchor portions 131-1 and 131-2 of interconnect springs 130-1 and 130-2 are respectively attached to base substrate 101 and disposed parallel to upper base surface 102. Curved body portion 133-1 of spring 130-11 extends from anchor portion 131-1 and curves away from the base surface 102 such that tip portion 135-1 abuts associated die contact pad 116-1 on lower die 110 at a (first) tip height H1. In contrast, curved body portion 133-2 of spring 130-21 extends from anchor portion 131-2 and curves away from the base surface 102 such that tip portion 135-2 abuts associated die contact pad 126-1 on upper die 120 at a (second) tip height H2, where tip height H2 is greater than tip height H1.

Assembly 100 has several advantages over conventional wire-bonded packaging approaches. First, assembly 100 exhibits a lower parasitic because the interconnect springs have a shorter length and lower inductance than conventional wire bonds. In addition, the package footprint (e.g., package width W) can be substantially smaller than that of wire-bond packages by disposing all of the interconnect springs between substrate 100 and dies 110 and 120, i.e., instead of being disposed on the outside periphery of the die. Further, the height H of the package can be smaller because the space required for the upper portion of the wire bonds is eliminated. Moreover, a higher density of interconnects is achievable, particularly for die 110, because the interconnect springs can be utilized to make interconnections to contact pads disposed on any portion of the (two-dimensional) area array interconnects.

Figure 3A:
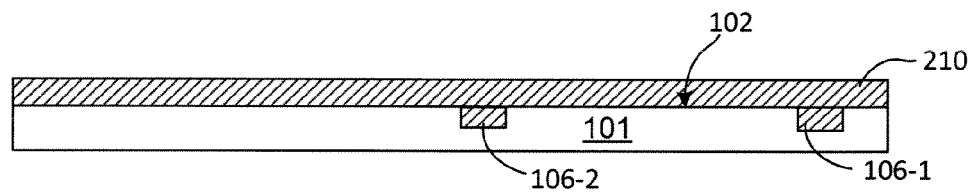
FIGS. 3(A), 3(B), 3(C), 3(D), 3(E) and 3(F) are cross-sectional side views depicting the formation of interconnect springs utilized in the assembly of FIG. 1 according to an embodiment of the present invention.
Figure 3B:
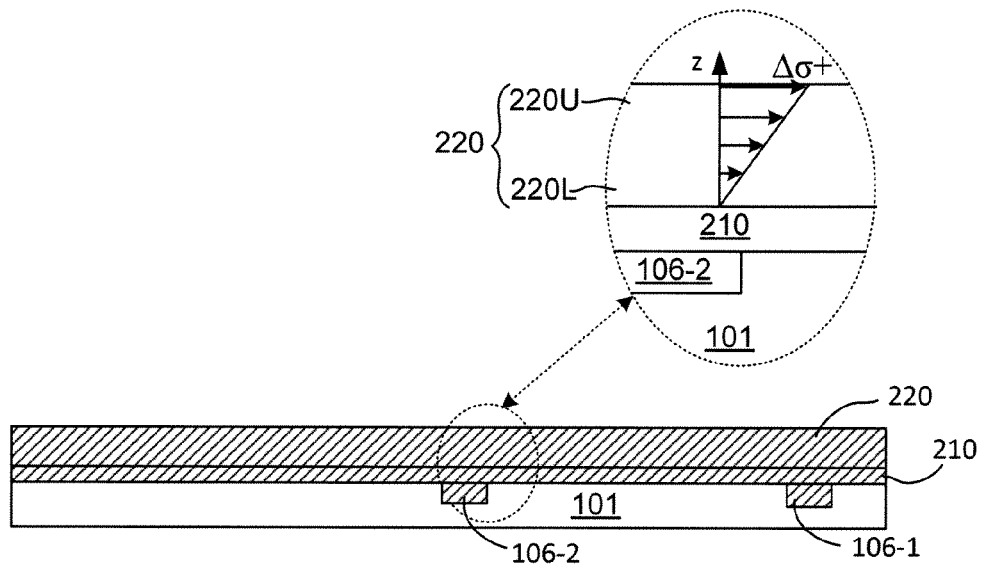
Figure 3C:
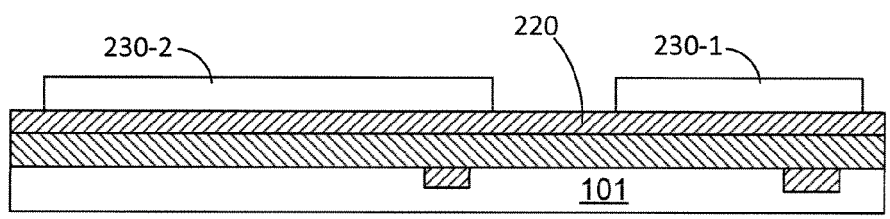
Figure 3D:
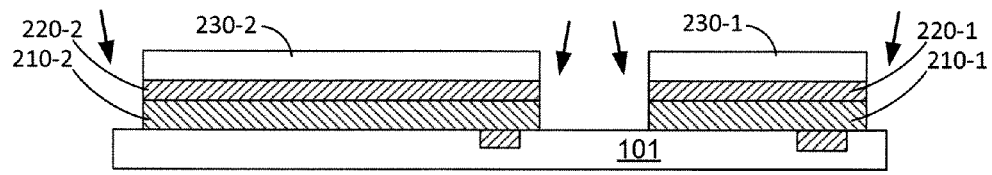
Figure 3E:
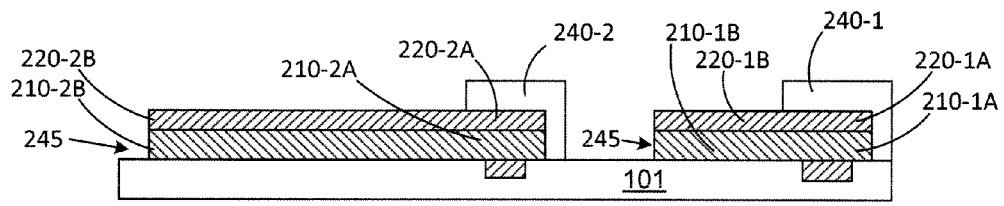
Figure 3F:
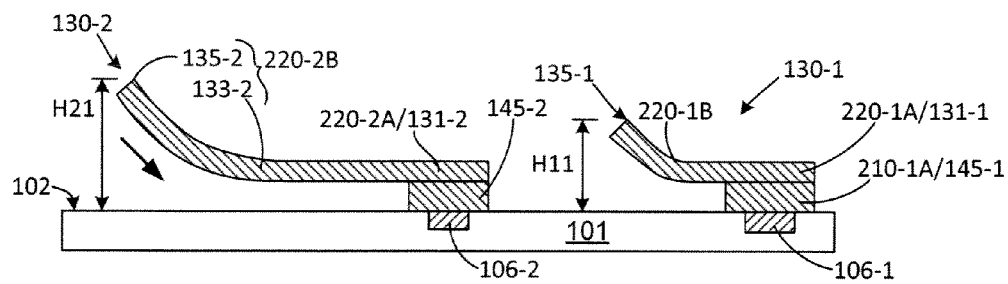

FIGS. 3(A) to 3(F) illustrate a method for producing interconnect springs according to a specific embodiment of the present invention. FIGS. 3(A) to 3(E) illustrate an exemplary process for forming and patterning a spring-metal film to form a plurality of flat spring-metal islands, and FIG. 3(F) illustrates one method for releasing or otherwise causing portions of each spring-metal island to bend in a way that forms the single-curved interconnect spring structure that is characteristic of the present invention. The following embodiment involves forming spring structures from a stress-engineered film that is sputtered or plated over an underlying wafer/substrate. As set forth in detail below, stress-engineered films are characterized in that they have an intentionally-induced stress gradient that cause the resulting spring structures to bend relative to the substrate upon release.

Referring to FIG. 3(A), a conductive release (sacrificial) layer 210 is deposited or otherwise formed on upper base surface 102 of base substrate 101 over contact pads 106-1 and 106-2. The purpose of release layer 210 is to facilitate a selective etching process that releases portions of the spring film from substrate 201 to form curved spring structures. The material utilized to form release layer 210 is selected such that base substrate 101 and the spring structures are not significantly damaged (e.g., etched) during the release process (i.e., the selective under-etching of the spring structure in the manner described below), and the anchor portion of each spring structure remains connected to substrate 201 via a portion of release layer 210 after the release process is completed. In these embodiments, release layer 210 is matched with the subsequently formed spring film material such that the spring material adheres to the release material. Suitable release materials include, for example, one or more of doped silicon (Si) or titanium (Ti) that is deposited onto substrate 201 using known techniques. In an alternative embodiment (not shown), a separate anchor pad is formed adjacent to the release material that is not removed during the selective etch, and serves to connect the spring probe to wafer/substrate 210. In yet another alternative embodiment, substrate 101 may itself be used as a release layer, (i.e., release film 210 is not formed on upper base surface 102, and the spring film is formed directly on base substrate 101) and the release process involves selectively etching into the upper base surface 102 to release the spring structures.

Referring to FIG. 3(B), spring film 220 is then formed (e.g., sputtered or plated) in a controlled manner such that lowermost portions 220L (i.e., the film material located closest to release material layer 210) has a higher internal compressive stress than uppermost portions 220U (i.e., the film material located furthest to release material layer 210), thereby forming internal stress variations in the growth direction (e.g., stress gradient Δσ+, which increases in the direction perpendicular to the upper surface of substrate 201, as indicated in the enlarged bubble section of FIG. 3(B)). The thickness of spring film 220 is determined in part by the selected spring material, formation technique, desired spring constant, and shape of the final spring structure.

Sputter-based methods for forming spring film 220 such that it has a suitable stress gradient Δσ+ (see FIG. 3(B)) are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 220 includes one or more metals suitable for forming a spring structure (e.g., one or more of molybdenum (Mo), a "moly-chrome" alloy (MoCr), tungsten (W), a titanium-tungsten alloy (Ti:W), chromium (Cr), nickel (Ni) and a nickel-zirconium alloy (NiZr)).

According to another embodiment, a spring film 220 (e.g. Ni, Cu, alloys) is deposited onto a seedlayer (e.g. Au, Ni) using electroplating or electroless plating techniques. Similar to the sputtered embodiment described above, in one embodiment the process parameters are changed during plating to generate a suitable stress gradient Δσ+, although it is possible to form a suitable film without changing the process parameters. According to an aspect of the present embodiment, a plating chemistry is used that deposits at least two elements into the film that can subsequently be transformed to an intermetallic phase using, for example, the annealing processes to bend the resulting spring structure such that its tip is positioned at the target distance away from the underlying substrate surface. In one specific embodiment, an Au seed layer is lithographically patterned and then sequentially exposed to an $Ni_3P$ (first) solution, which forms a relatively compressive lower spring layer portion on the release layer, and then an $Ni_3B$ (second) solution, which forms a relatively tensile upper spring layer portion on the lower spring layer portion. The total thickness of the Ni-based spring film layer is in the range of 0.5 to 5.0 microns. Other plated spring types may include Cu with various hardening materials added thereto that are formed using either electroless plating or electroplating. The Cu plating process is performed such that a stress-gradient is formed in the plated material in the plating direction (i.e., similar to that described above for the sputtered embodiments) by, for example, either varying a parameter during the plating process (e.g. changing current density while plating), or using two different plating baths with different stress characteristics. In yet another alternative embodiment, the plating may be performed using electroplating techniques (i.e., after depositing a suitable seed material (e.g., Au; not shown) onto the upper surface of the release material). Note that release layer 210 must be a conductive material, such as Ti, in order for electroplating to be performed. Note also that the plated material may be formed as a continuous layer and then etched as described below to form individual spring structures, or individual spring structures 220 may be formed directly by plating through a hard mask (e.g., resist).

Figure 4A:
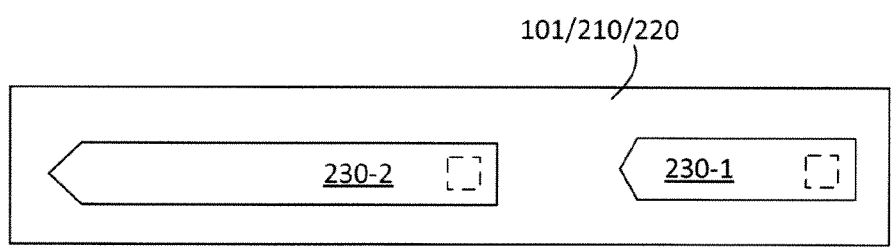
FIGS. 4(A) and 4(B) are top plan views showing intermediate stages of the interconnect spring production process of FIGS. 3(A) to 3(F)
Figure 4B:
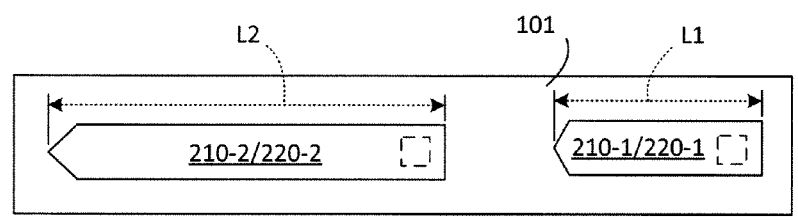

When the continuous film approach (discussed above) is utilized, the sputtered or plated stress-engineered film must be etched to form unreleased spring structures (i.e., spring-metal islands). FIGS. 3(C) and 3(D) are cross-sectional side views and FIGS. 4(A) and 4(B) are top plan views illustrating the etching process according to an embodiment of the present invention. As indicated in FIGS. 3(C) and 4(A), this etching process typically employs elongated spring masks 230-1 and 230-2 (e.g., photoresist) that are patterned over selected portions of spring material film 220. Next, as indicated in FIGS. 3(D) and 4(A), exposed portions of spring material film 220 and release layer 210 surrounding spring mask 310 are etched away using one or more etchants 320 to form separated spring-metal islands 220-1 and 220-2. This etching process is performed using, for example, a wet etching process, anisotropic dry etching, or physical ion etching methods, such as Argon ion milling. In yet another possible embodiment, the etching process can be performed using the electro-chemical etching process. Many additional process variations and material substitutions are therefore possible and the examples given are not intended to be limiting. As indicated in FIGS. 3(C) and 4(B), upon completion of the etching process, each elongated spring-metal island (e.g., spring-metal island 220-1) is attached along its entire length to base substrate 101 by way of release layer 210. Note that at this stage of the fabrication process, all of the spring structures are in an "unreleased" state.

The next stage of the spring formation process involves releasing a portion of each spring-metal island such that the stress gradient stored in the released portion causes the released portion to bend away from base substrate 101 in order to form the characteristic single-curve spring structure. As indicated in FIG. 3(E), in one embodiment the release process involves forming a release mask portion 240-1 over an anchor portion 220-1A of spring-metal island 220-1 and a release mask portion 240-2 over an anchor portion 220-2A of spring-metal island 220-2. Note that the release mask defines release windows that expose second portions 220-1B and 220-2B of spring-metal islands 220-1 and 220-2, respectively. In one embodiment, the release mask is formed using photoresist. In other embodiments, a suitable metal or epoxy may be used. In yet another embodiment, no release mask is used, but the size (e.g., width) of the anchor (fixed) portion of the spring probe is larger than a width of the free portion (or free portion is perforated), and hence the release etching can be timed and stopped when the free portion releases from the underlying substrate (whereby the fixed (anchor) portion is only partially underetched, and remains attached to the substrate). A release etchant (e.g., a buffered oxide etch) is then use to selectively remove a portion of the release material layer from beneath the exposed portion of the spring structure. As indicated in FIG. 3(F), removal of the exposed release material separates first (free) portion sections 220-1B and 220-2B from base substrate 101, thereby causing these portions to bend away from upper base surface 102 due to the internal stress variations established during the formation of the spring film (discussed above). That is, released portions 220-1B and 220-2B form the body and tip portions of each released spring (e.g., referring to the left side of FIG. 3(F), released spring-metal island portion 220-1B forms body portion 133-2 and tip portion 135-2 of completed interconnect spring 130-2). Note that portions 220-1A and 220-2A of spring-metal islands 220-1 and 220-2 and release layer portions 210-1A and 210-2A are protected by release mask portions 240-1 and 240-2 (see FIG. 3(E)) during the release process, causing these portions to remain secured (attached) to planar base substrate 101 after release to form flat anchor portions 131-1 and 131-2 and conductive release portions 145-1 and 145-2 of completed interconnect springs 130-1 and 130-2. The resist mask is optionally removed from anchor portions 220-1A/131-1 and 220-2A/131-2 of spring probe 220-1 after release, as indicated in FIG. 3(F).

FIGS. 3(E) and 3(F) illustrate an exemplary process of causing portions 220-1B and 220-2B of each spring-metal island 220-1 and 220-2 to bend relative to planar base surface 102 such that each of these portions forms a corresponding single-curved body portion 133-1 and 133-2 that extends away from anchor portions 131-1 and 131-2, with tip portions 135-1 and 135-2 disposed at the free ends of body portions 133-1 and 133-2, respectively. The exemplary embodiment also illustrates one method for generating interconnect springs 130-1 and 130-2 in a way that causes the tip portions of a shorter group of springs (e.g., tip portion 135-1 of shorter interconnect spring 130-1 and all others intended to contact die 110) to be positioned a relatively short (first) nominal distance H11 from base surface 102, and causing tip portions of longer springs (e.g., tip portion 135-2 of longer interconnect spring 130-2 and all others intended to contact die 120) to be positioned a relatively high (second) nominal distance H21 from base surface 102, where nominal H21 is greater than nominal distance H11. Referring to FIG. 4(B), the method utilized in the exemplary embodiment involves forming flat spring-metal island e.g., 220-1 to have a relatively short (first) length L1, and forming flat spring-metal island 220-2 to have a relatively long (second) length L2, where length L2 is longer than length L1, whereby upon release the tips of the longer springs assumes a greater height than the tips of the shorter springs.

FIGS. 5(A) to 5(D), 6(A) and 6(B) illustrate an exemplary process of mounting smaller die 110 and a larger die 120 onto the tip portions of fully released interconnect springs 130 in an upside-down pyramid-type stacked arrangement such that die 110 is disposed between die 120 and base substrate 101, and such that a peripheral upper edge portion 122P of front surface 122 of larger die 120 is exposed around a first peripheral side edge 111S of smaller die 110.

Figure 5A:
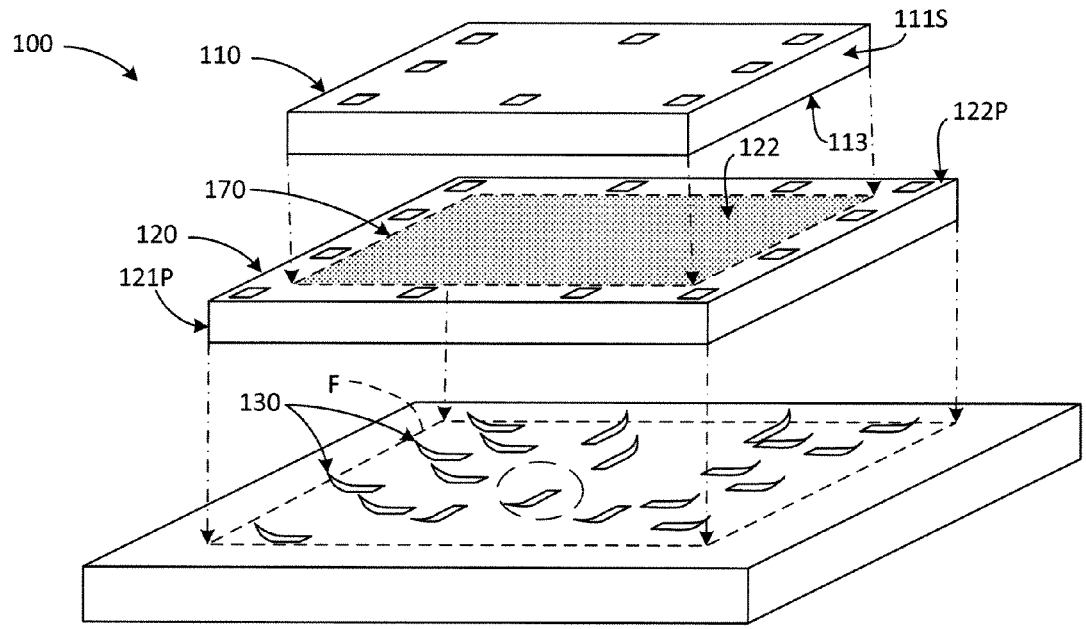
FIGS. 5(A), 5(B), 5(C) and 5(D) are exploded and assembled perspective views showing assembly of IC chips onto the interconnect springs according to another embodiment of the present invention.

FIG. 5(A) is an exploded perspective view showing all of base substrate 101 and dies 110 and 120 in an upright orientation (i.e., note that dies 110 and 120 are "flipped" before being mounted onto substrate 101). Note that a small number of contact pads (shown on dies 110 and 120) is used to simplify the description, and that typically many more contacts are utilized.

As illustrated in FIG. 5(A), according to a preferred embodiment all interconnect springs 130 are disposed inside a footprint area F that is defined by an outer peripheral edge 121P of larger die 120. As mentioned above, disposing springs 130 in footprint area F (i.e., the area taken up by the largest die in the assembly) provides the advantage described above over wire bond interconnect approaches in that this facilitates a minimal overall footprint area taken up by completed package assembly.

As also illustrated in FIG. 5(A), according to the exemplary embodiment dies 110 and 120 are connected together prior to assembly onto base substrate 101. In the disclosed embodiment, this connection is achieved by way of an adhesive 170 that is disposed on upper surface 122 of larger die 120 (or on rear surface 113 of smaller die 110), and is disposed between rear surface 113 front surface 122 when dies 110 and 120 are pressed together, thereby fixedly connecting die 110 to die 120 in the manner shown in FIG. 5(B).

Figure 5B:
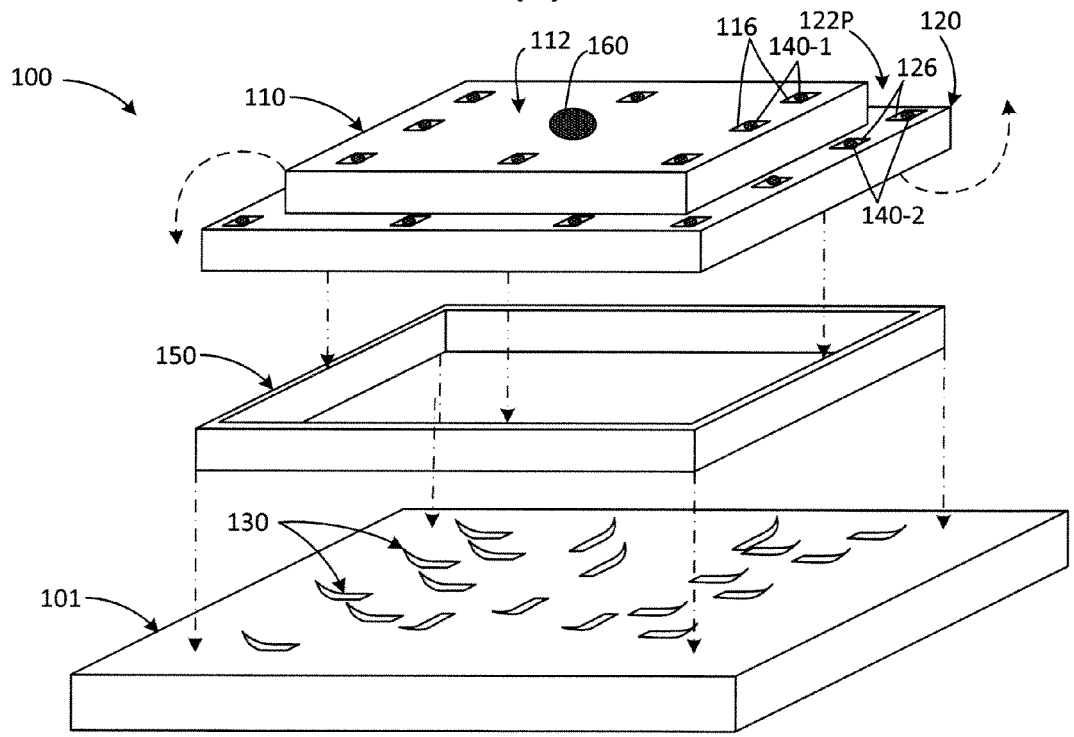
Figure 5C:
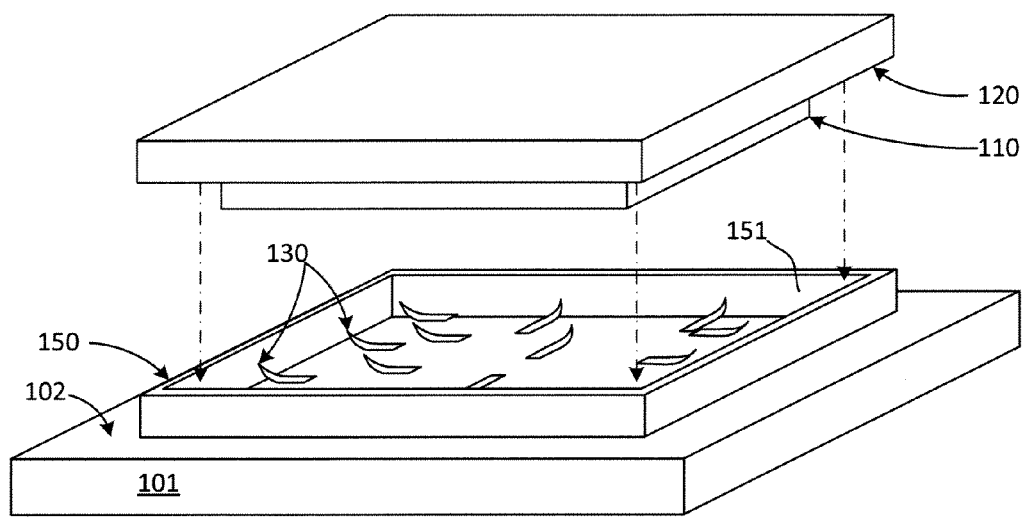

FIG. 5(B) shows the sub-assembly formed by dies 110 and 120, and also shows solder portions 140-1 and 140-2, a frame-like rigid spacer 150, and adhesive 160 that are utilized in accordance with an embodiment of the present invention. Solder portions 140-1 and 140-2 are respectively deposited on contact pads 116 and 126 prior to the assembly of dies 110 and 120 onto base substrate 101, and as described below serve to attach the tip portions of interconnect springs 130 to associated contact pads 116 and 126 in the completed assembly. As indicated by the dashed-line arrows in the lower portion of FIG. 5(B), spacer 150 is mounted on upper base surface 102 before the sub-assembly formed by dies 110 and 120 is mounted (i.e., such that, as shown in FIG. 5(C), said spacer 150 is disposed between base substrate 101 and at least one of dies 110 and 120). Adhesive 160 is disposed on die 110 such that, after the assembly process is completed, it is positioned to fixedly connect base substrate 101 to dies 110 and 120.

Figure 6A:
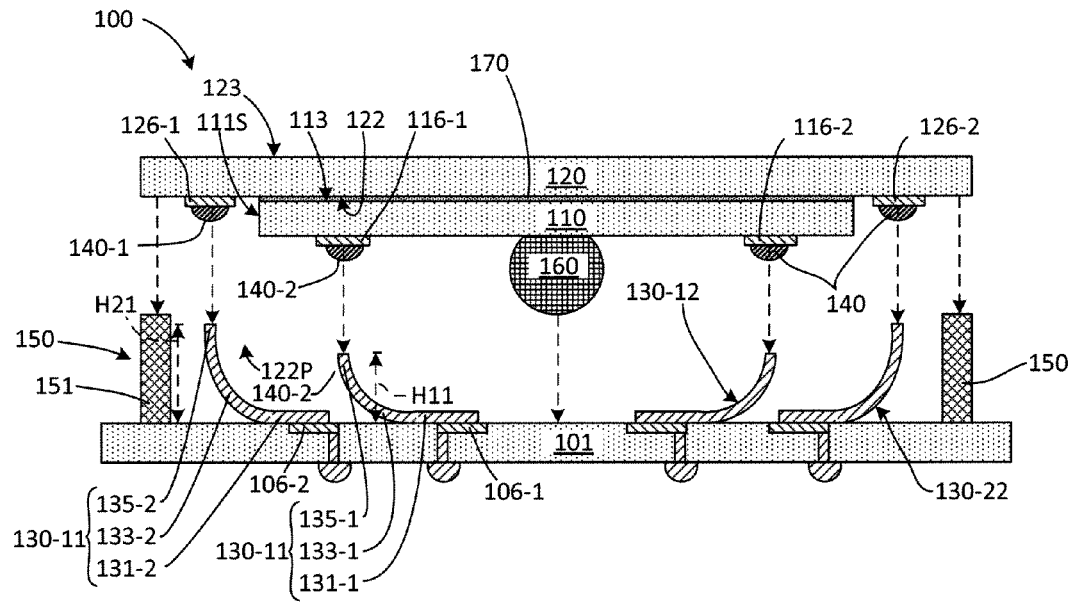
FIGS. 6(A) and 6(B) are cross-sectional side views showing contact between the IC chips and the interconnect springs during the IC mounting process of FIG. 5(C)
Figure 6B:
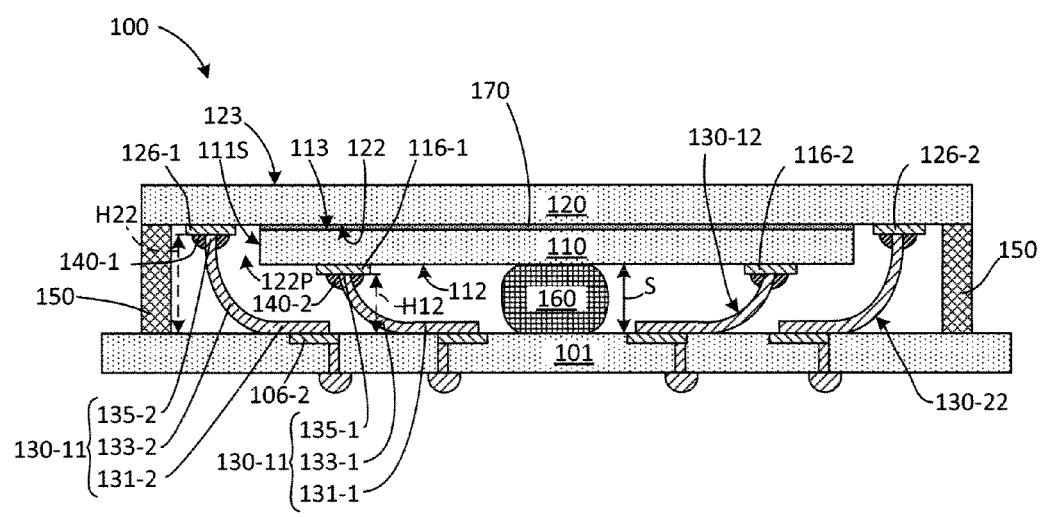

As indicated by the curved dash-lined arrows in FIG. 6(B), the sub-assembly including dies 110 and 120 is flipped (i.e., inverted such that upper surface 112 of die 110 faces base substrate 101) prior to assembly onto springs 130.

FIGS. 5(C), 6(A) and 6(B) illustrate the process of mounting die 110 and 120 onto base substrate 101 in accordance with the exemplary embodiment. As indicated in FIGS. 5(C) and 6(A), optional spacer 150 is mounted onto base substrate 101 such that outer wall 151 surrounds interconnect springs 130, and with dies 110 and 120 disposed in the "flip-chip" (upside down pyramid-type) arrangement with smaller die 110 disposed between larger die 120 and base substrate 101, and with peripheral region 122P exposed outside peripheral edge 111S.

In the exemplary embodiment, spacer 150 is secured (e.g. using an adhesive) to upper base surface 102 before dies 110 and 120 are mounted. As indicated in FIGS. 6(A) and 6(B), outer wall 151 is sized such that die 110 is received inside spacer 150, and outer wall 151 contacts and supports the outer peripheral edge of die 120, thereby maintaining dies 110 and 120 at a predetermined optimal distance from upper base surface 102.

As described above, the die mounting process is performed such that the tip portions of corresponding interconnect springs 130 connect with associated contact pads disposed on dies 110 and 120. For example, contact pad 116-1 of die 110 is brought into contact with tip 135-1 of spring 130-1 by way of solder portion 140-1, and is therefore coupled to base contact pad 106-1 by way of spring body 133-1 and anchor portion 131-1. At the same time, contact pad 126-1 of die 120 is brought into contact with tip 135-2 of spring 130-2 by way of solder portion 140-2, which in turn is connected to base contact pad 106-2 by way of spring body 133-2 and anchor portion 131-2.

According to an aspect of the invention, the die mounting process is performed such that at least one of springs 135-1 and 135-2 are slightly compressed during the mounting process. That is, springs 135-1 and 135-2 are formed with initial tip heights H11 and H21 that are higher than the expected distance between upper base surface 102 and the corresponding lower surfaces of dies 110 and 120. As such, as indicated in FIG. 6(B), at least one of spring 135-1 and spring 135-2 is compressed during the mounting process. That is, either tip 135-1 is pushed downward by die 110 to a final tip height H12 that is smaller than initial tip height H11, or tip 135-2 is pushed downward by die 120 to a final tip height H22 that is smaller than initial tip height H21. Springs 130-12 and 130-22 are connected to contact pads 115-2 and 126-2 and compressed in the same manner. Preferably, initial tip heights H11 and H12 are set such that all of the interconnect springs undergo at least some compression in order to produce and maintain reliable contact between base substrate 101 and dies 110 and 120. This arrangement provides advantages over conventional solder-based flip-chip packaging approaches in that springs 130-1 and 130-2 maintain the required connections to contact pads 116-1 and 126-1 over a relatively large range of offset distances between substrate 101 and dies 110 and 120, thereby providing a more compliant packaging technology that helps address thermal expansion mismatches (and other production variances) between the die and the substrate materials. That is, by causing compression of the interconnect springs during the mounting process, the present invention avoids poor or failed connections that can occur using solder-based flip-chip approaches due to minor processing inconsistencies. In addition, the resilient characteristics of the interconnect springs allow them to further compress or slightly decompress to maintain reliable connections in the event of thermal expansion mismatch variances.

As also indicated FIG. 6(B), solder portions 140-1 and 140-2 and adhesive 160 are then activated to secure dies 110 and 120 to base substrate 101. That is, after the mounting process is completed, solder portions 140-1 and 140-2 are re-flowed to secure (solder) tips 135-1 and 135-2 to contact pads 116-1 and 126-1, respectively. Adhesive 160 is disposed in a way that bridges between die 110 and base substrate 101, thereby securing die 110 to upper base surface 102 after a suitable curing process. Note that adhesive 160 effectively secures die 120 to base substrate 101 as well due to its connection to die 110 by way of adhesive 170.

Figure 5D:
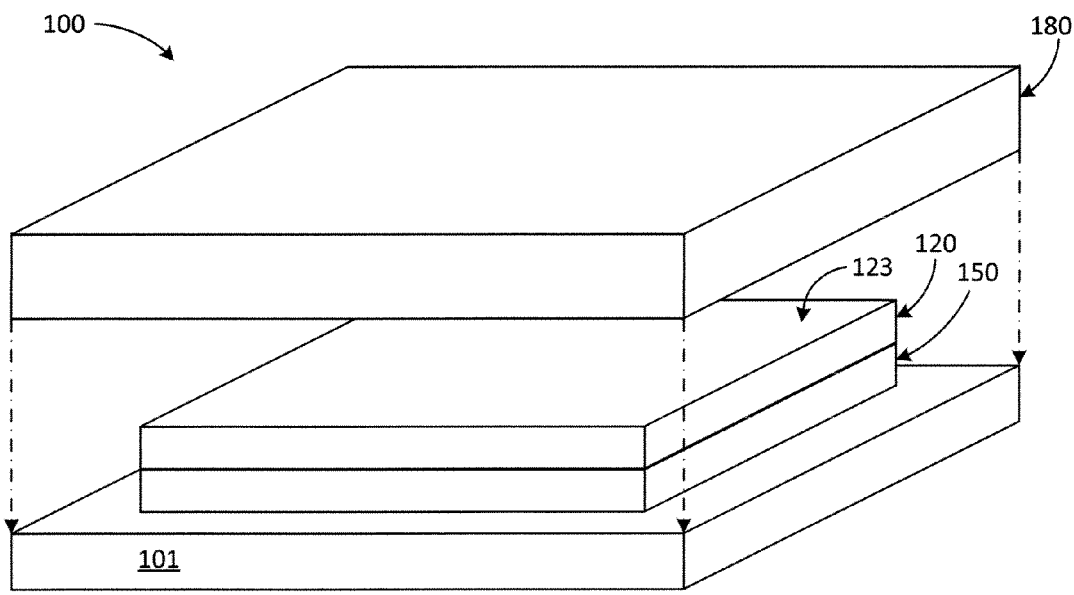

FIG. 5(D) shows an optional final stage for completing assembly 100 in which an optional protective cover 180 is formed over upper surface 123 of die 120, the outer peripheral surface of spacer 150, and any remaining exposed portion of base substrate 101. Cover 180 is formed using any conventional method (e.g., glob top), or may be a pre-formed structure that is secured by adhesive to enclose assembly 100.

Figure 7A:
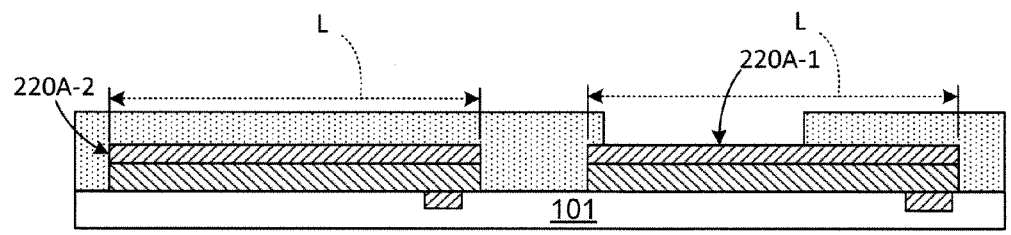
FIGS. 7(A), 7(B) and 7(C) are cross-sectional side views showing a method for generating interconnect springs having different release heights according to another embodiment of the present invention.
Figure 7B:
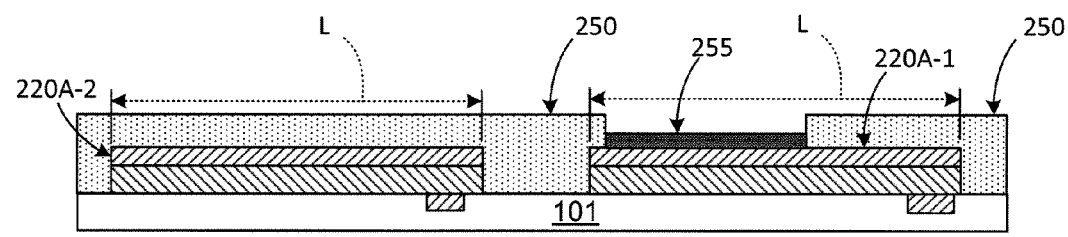
Figure 7C:
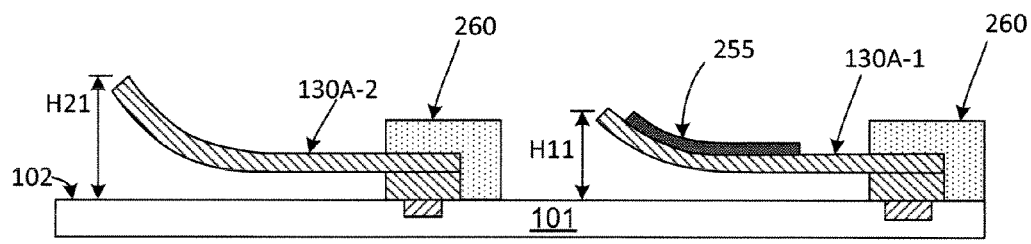

FIGS. 7(A) to 7(C) illustrate another method for producing interconnect spring having different initial tip heights. Referring to FIG. 7(A), stress-engineered spring-metal islands 220A-1 and 220A-2 are patterned in the manner described above, but in this case have the same length L, and then an additional mask 250 is formed that entirely covers spring-metal island 220A-2 and exposes a portion of spring-metal island 220A-1. As indicated in FIG. 7(B), a load material 255 is then deposited on flat spring-metal island 320A-1 (and like portions of all other spring-metal islands in the group of springs that are intended to contact the lowermost IC chip) through the opening in mask 250. Referring to FIG. 7(C), a release mask 260 is then formed over the anchor portions of each spring-metal island, and the springs are released in the manner described above to form single-curved interconnect springs 130A-1 and 130A-2. Note that, due to load layer 255, the tip lift-height H1 of spring 130A-1 is lower than lift-height H2 of spring 130A-2. By varying the amount of load material disposed on each spring, the tip heights of all the spring can be adjusted to produce optimal conditions for mounting the IC chips.

Figure 8A:
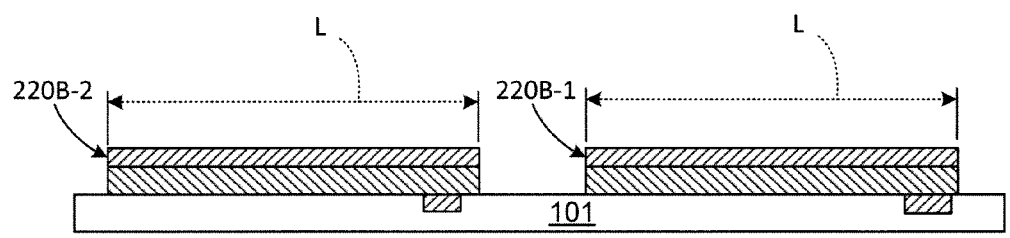
FIGS. 8(A), 8(B) and 8(C) are cross-sectional side views showing a method for mounting IC chips on interconnect springs having the same release heights according to another embodiment of the present invention.
Figure 8B:
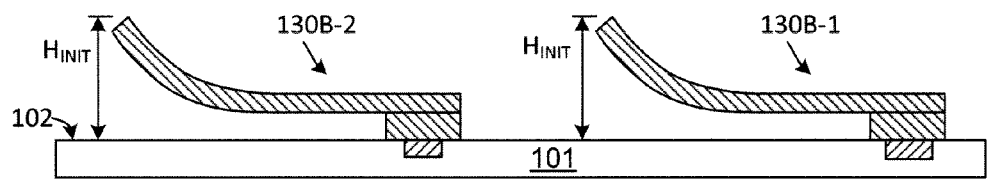
Figure 8C:
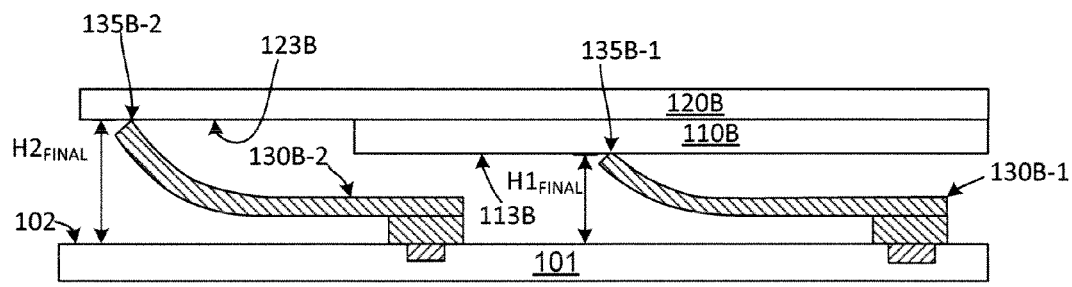

FIGS. 8(A) to 8(C) illustrate another approach in which all of the interconnect springs are formed with the same tip height. FIG. 8(A) shows that spring-metal islands 220B-1 and 220B-2 are patterned in the manner described above to have the same length L, and then released as shown in FIG. 8(B) to form interconnect springs 130B-1 and 130B-2 having the same initial tip height $H_{INIT}$. In this case, the resilience of springs 130B-1 and 130B-2 is utilized to achieve the desired final tip heights $H1_{FINAL}$ and $H2_{FINAL}$ (shown in FIG. 8(C)), which are determined by the position of dies 110B and 120B. That is, springs 130B-1 deflects further downward from the initial spring height $H_{INIT}$ (FIG. 8(B)) than spring 130B-2 because lower surface 113A of die 110B is closer to base substrate 101 than lower surface 123B of die 120B. Note that, due to the larger compression of spring 110B, tip 135B-1 of spring 130B-1 slides/scrubs a longer distance along lower die surface 113A than that of tip 135B-2 of spring 130B-2.

Figure 9:
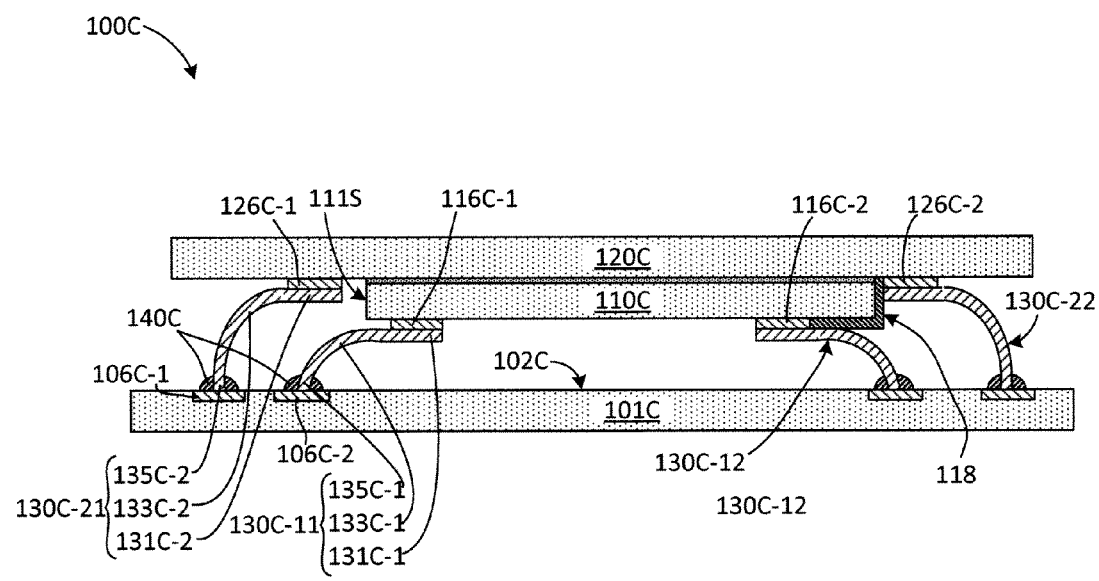
FIG. 9 is a cross-sectional side view showing a flip-chip, stacked-die electronic package assembly according to an alternative simplified embodiment of the present invention.

FIG. 9 shows an electronic assembly 100C according to another embodiment of the present invention. Assembly 100C differs from previous embodiment in that the interconnect springs are formed on dies 110C and 120C instead of on base 110C. That is, springs 130C-11 and 130C-12 are formed on die 110C and released in the manner described above, and then die 110C is mounted onto base substrate 101C such that springs 130C-11 and 130C-12 are operably connected to contact pads disposed on base substrate 101C. For example, anchor portion 131C-1 of (first) interconnect spring 130C-11 is attached to smaller die 110C (i.e., anchor portion 131C-1 is disposed parallel to front die surface 1120), curved body portion 133C-1 of spring 130C-11 extends away front die surface 112C, and tip portion 135C-1 abuts a (first) base contact pad 106C-1 disposed on upper surface 1020 of base substrate 101C. Similarly, springs 1300-21 and 130C-22 are formed on die 120C and released in the manner described above, and then die 1200 is mounted such that springs 130C-21 and 130C-22 are operably connected to contact pads disposed on base substrate 1010 (e.g., anchor portion 131C-2 of (second) interconnect spring 130C-21 is attached to larger die 1200, curved body portion 133C-2 extends away front die surface 1120, and tip portion 135C-2 abuts a (second) base contact pad 1060-2 on base substrate 1010). Similar to assembly 110A (described above), assembly 100C assembly utilizes optional solder portions 140C to attach tip portions 135C-1 and 135C-2 to base contact pads 106C-1 and 106C-2, respectively. Assembly 100C otherwise operates as described above.

In accordance with another alternative embodiment of the prevention invention, assembly 100C is further characterized by metal trace 118 connected between a (first) flat anchor portion 131C-1 on smaller die 130C-1 and a (second) flat anchor portion 131C-2 on larger die 130C-2. Such multi-level interconnection traces facilitate shared signals between the dies, and allow utilization of the relatively large surface area of lowermost die 110C to make a larger number of connections between base substrate 101C and upper die 120.

Figure 10:
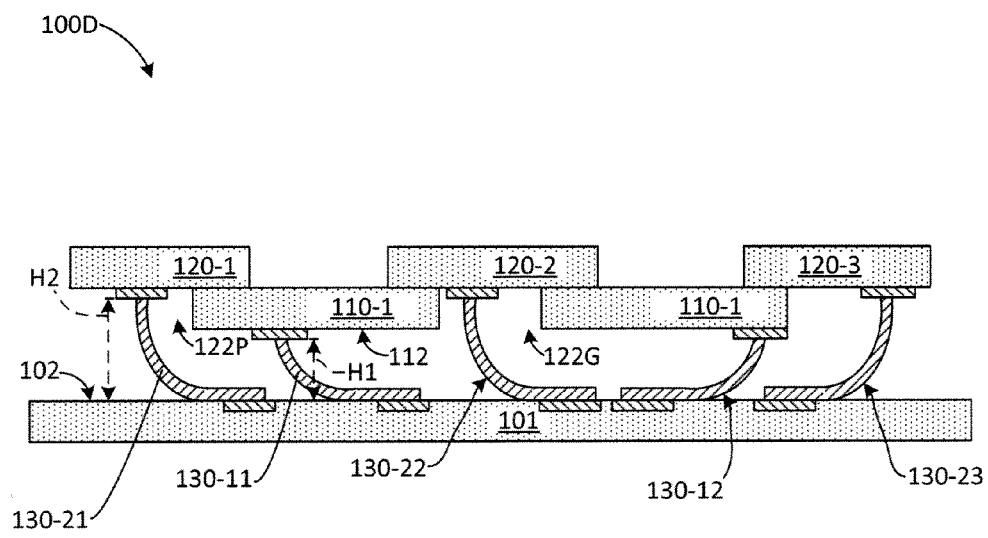
FIG. 10 is a cross-sectional side view showing a flip-chip, stacked-die electronic package assembly according to an alternative simplified embodiment of the present invention.

FIG. 10 is a cross-sectional diagram showing a simplified flip-chip, offset stacked-die electronic package assembly 100D according to another simplified exemplary embodiment of the present invention. Assembly 100 generally includes two lower (first) die 110-1 and 110-2 and three upper (second) die 120-1, 120-2 and 120-3 that are secured to each other by an adhesive or other means, and connected to a base substrate 101 by way of single-curved interconnect springs 130-11, 130-12, 130-21, 130-22 and 130-23. As in the previous embodiments, lower dies 110-1 and 110-2 and upper dies 120-1 to 120-3 are "bare" (unpackaged) chips that are disposed in a "flip-chip" (upside-down) stacked arrangement over base substrate 101 such that the lower surfaces of lower dies 110-1 and 110-2 are maintained at a first height H1 from substrate upper surface 102, and such that at least a portion the lower surface of each upper die 120-1, 120-2 and 120-3 is exposed either in a peripheral area 122P or in an an internal gap area 122G at a second eight H2 from surface 102. As in the previous embodiments, springs 130-11 and 130-12 are connected between substrate 101 and lower dies 110-1 and 110-2, respectively, and the second group of interconnect springs, which includes springs 130-21, 130-22 and 130-23, are connected between substrate 101 and upper dies 120-1, 120-2 and 120-3, respectively.

Although the present invention has been described with respect to certain specific embodiments, it will be clear to those skilled in the art that the inventive features of the present invention are applicable to other embodiments as well, all of which are intended to fall within the scope of the present invention. For example, the stacked-die pyramid-type arrangement can be modified to include three or more die in each assembly stack, and the multiple-chip offset die arrangement of FIG. 10 can be modified to include additional chips at different heights from the base substrate. Further, the IC chips can be mounted separately (i.e., one at a time) during the mounting process (that is, the two die 110 and 120 shown in FIG. 5(A) are mounted directly onto base substrate 101 without being secured together first by adhesive 170). In addition, a clamping structure could hold the die stack to the base substrate. This mode of assembly is generally more costly, but facilitates rework. For high power applications, this function could be combined with the heat sink. In yet another embodiment, a packaged electronic device may include a combination of the interconnect springs described above in combination with through substrate electrical interconnects, other flip chip technologies (solder bumps, gold bumps) or wire-bonding.

The invention claimed is:

1. A flip-chip, stacked-die electronic package assembly comprising:
   a base substrate including a planar base surface and a plurality of base contact pads disposed on the base surface;
   a first die and a second die disposed in an offset stacked arrangement with the first die located between the second die and the base substrate such that a planar first surface of the first die faces a planar second front surface of the second die such that an upper edge portion of the second front surface is exposed adjacent to a first peripheral side edge of the first die, wherein the first die includes a plurality of first die contact pads disposed on the first front surface, and wherein the second die includes a plurality of second die contact padsdisposed on the second front surface in said upper edge portion; and
   a plurality of single-curved interconnect springs, each said interconnect spring having a flat anchor portion and a curved body portion extending away from the anchor portion, and a tip portion disposed at the end of the body portion, wherein said plurality of interconnect springs include:
      a first interconnect spring extending between the substrate and the first die and connected such that the first interconnect spring forms a first electrical connection between a first base contact pad of said plurality of base contact pads and an associated first die contact pad of said plurality of first die contact pads, and
      a second interconnect spring extending between the substrate and the second die and connected such that the second interconnect spring forms a second electrical connection between a second base contact pad of said plurality of base contact pads and an associated second die contact pad of said plurality of second die contact pads.

2. The electronic assembly according to claim 1,
   wherein first and second flat anchor portions of the first and second interconnect springs, respectively, are attached to the base substrate and disposed parallel to the base surface,
   wherein a first curved body portion of the first interconnect spring extends from the first flat anchor portion away from the base surface such that a first tip portion disposed at an end of the first curved body portion abuts said associated first die contact pad, and
   wherein a second curved body portion of the second interconnect spring extends from the second flat anchor portion away from the base surface such that a second tip portion disposed at an end of the second curved body portion abuts said associated second die contact pad.

3. The electronic assembly according to claim 2, wherein the first and second tip portions are respectively attached to the associated first and second die contact pads by way of solder portions.

4. The electronic assembly according to claim 1, further comprising a rigid spacer disposed between the substrate and at least one of said first and second dies.

5. The electronic assembly according to claim 1, further comprising an adhesive fixedly connected between the substrate and at least one of said first and second dies.

6. The electronic assembly according to claim 1, further comprising an adhesive fixedly connected between the first rear surface of the first die and the second front surface of the second die such that the first die is secured to the second die.

7. The electronic assembly according to claim 1, wherein the plurality of springs are disposed inside a footprint area defined by an outer peripheral edge of said first and second dies.

8. The electronic assembly according to claim 1,
   wherein a first anchor portion of the first interconnect spring is attached to the first die and disposed parallel to the first front surface, wherein a first curved body portion of the first interconnect spring extends from the first flat anchor portion away from the first front surface such that a first tip portion disposed at an end of the first curved body portion abuts said associated first base contact pad, and wherein a second anchor portion of the second interconnect spring is attached to the second die and disposed parallel to the second front surface, wherein a second curved body portion of the second interconnect spring extends from the second flat anchor portion away from the second front surface such that a second tip portion disposed at an end of the second curved body portion abuts said associated second base contact pad.

9. The electronic assembly according to claim 8, wherein the first and second tip portions are respectively attached to the associated first and second base contact pads by way of solder portions.

10. The electronic assembly according to claim 8, further comprising a metal trace connected between the first flat anchor portion on the first die and the second flat anchor portion on the second die.

11. The electronic assembly according to claim 1, wherein the offset stacked arrangement comprises a pyramid-type stacked arrangement with the first die concentrically positioned with the second die such that an upper peripheral edge portion of the second front surface is exposed around a first peripheral side edge of the first die.

12. The electronic assembly according to claim 1, further comprising:
a third die disposed substantially parallel to the first die and separated by a gap, and a fourth die disposed on the first and third dies, and positioned over the gap; and
a third interconnect spring extending between the substrate and the fourth die and connected such that the third interconnect spring forms a third electrical connection between the base substrate and the fourth die.

13. A method for producing a flip-chip, stacked-die electronic assembly comprising:
forming a plurality of flat spring-metal islands on a planar base surface of a base substrate such that all of the spring-metal islands are disposed parallel to the planar base surface;
causing portions of each of the spring-metal islands to bend relative to the planar base surface such that each spring-metal island forms an associated interconnect spring having a flat anchor portion attached to the planar base surface, a curved body portion extending away from the anchor portion, and a tip portion disposed at the end of the body portion; and
mounting a first die and a second die onto the tip portions of the plurality of interconnect springs such that the first die and the second die are disposed in an offset stacked arrangement with the first die located between the second die and the base substrate, and such that an upper edge portion of the second front surface is exposed adjacent to a first side edge of the first die, and such that at least some of the plurality of interconnect springs are compressed,
wherein said mounting includes causing said tip portions of a first group of said plurality of interconnect springs to contact a plurality of first die contact pads disposed on the first front surface of the first die, and causing said tip portions of a second group of said plurality of interconnect springs to contact a plurality of second die contact pads disposed in said upper edge portion of the second front surface.

14. The method of claim 13, wherein causing said portions of each of the spring-metal islands to bend relative to the planar base surface comprises causing first tip portions of said spring-metal islands of the first group to be positioned a first nominal distance from said base surface, and causing tip portions of said spring-metal islands of the second group to be positioned a second higher nominal distance from said base surface, said second nominal distance being greater than said first nominal distance.

15. The method of claim 14, wherein forming the plurality of flat spring-metal islands comprises patterning a spring-metal film disposed on the planar base surface to form both a first group of said flat spring-metal islands having a first length, and a second group of said flat spring-metal islands having a second length, the second length being longer than the first length.

16. The method of claim 14, wherein forming the plurality of flat spring-metal islands comprises depositing a load material on each said flat spring-metal island of the first group.

17. The method of claim 13, further comprising soldering the tip portions of each of said first group of said plurality of interconnect springs to an associated said first die contact pad, and soldering the tip portions of each of said second group of said plurality of interconnect springs to an associated said second die contact pads.

18. The method of claim 13, further comprising disposing an adhesive between the planar base surface and at least one of said first die and said second die such that said at least one of said first die and said second die is secured to the base substrate by said adhesive.

19. The method of claim 13, further comprising mounting a spacer on the planar base surface before mounting said first die and said second die such that said spacer is disposed between the base substrate and at least one of said first die and said second die.

20. A method for producing a flip-chip, stacked-die electronic assembly comprising:
forming a plurality of flat spring-metal islands on a planar base surface of a first die and in a peripheral upper edge portion of a second front surface of a second die, the second die being larger than the first die;
causing portions of each of the spring-metal islands to bend such that each spring-metal island forms an associated interconnect spring having a flat anchor portion attached to one of said first and second die, a curved body portion extending away from the anchor portion, and a tip portion disposed at the end of the body portion; and
mounting the first die and the second die onto a base substrate in an offset stacked arrangement with the first die located between the second die and the base substrate, and such that the tip portion of each of the plurality of interconnect springs contacts a corresponding base contact pad disposed on a surface of the base substrate,
wherein said mounting includes causing a first group of said plurality of interconnect springs to form electrical connections between a plurality of first die contact pads disposed on the first front surface of the first die and an associated first group of base contact pads disposed on the base substrate, and causing a second group of said plurality of interconnect springs to form electrical connections between a plurality of second die contact pads disposed in said peripheral upper edge portion of the second front surface and an associated second group of base contact pads disposed on the base substrate.

* * * * *